(12) United States Patent
Goller et al.

(10) Patent No.: US 7,145,831 B2
(45) Date of Patent: Dec. 5, 2006

(54) DATA SYNCHRONIZATION ARRANGEMENT

(75) Inventors: Joerg Goller, Zweikirchen (DE); Norbert Reichel, Wartenberg (DE)

(73) Assignee: Texas Instruments Deutschland, GmbH, Dallas, TX (US)

( * ) Notice: Subject to any disclaimer, the term of this patent is extended or adjusted under 35 U.S.C. 154(b) by 9 days.

(21) Appl. No.: 11/071,673

(22) Filed: Mar. 3, 2005

(65) Prior Publication Data
US 2005/0201191 A1    Sep. 15, 2005

(30) Foreign Application Priority Data
Mar. 10, 2004  (DE)  ............ 10 2004 011 672

(51) Int. Cl.
*G11C 8/00*    (2006.01)
(52) U.S. Cl. ............ 365/233; 365/189.12; 365/189.02; 365/189.05; 365/221
(58) Field of Classification Search ................ 365/233, 365/189.12, 189.02, 189.05, 221
See application file for complete search history.

(56) References Cited
U.S. PATENT DOCUMENTS 6,337,826 B1 *  1/2002  Imai et al. ................ 365/221
6,603,706 B1 *  8/2003  Nystuen et al. ............. 365/233

* cited by examiner

Primary Examiner—Son T. Dinh
Assistant Examiner—N Nguyen
(74) Attorney, Agent, or Firm—W. James Brady, III; Frederick J. Telecky, Jr.

(57) ABSTRACT

A data synchronization arrangement is provided that is fail-safe at high speed and low power consumption, for exchanging clocked data between different clock domains running in a digital processing equipment at the same clock frequency but at an arbitrary relative phase shift. A register arrangement has a predetermined number of parallel registers, each register having a data input, a write clock input, a read clock input and a data output. A write select multiplexer has an input receiving a write clock signal from a first clock domain, one clock output for each of the parallel registers and connected to a write clock input of a respective register, and one write select input for each clock output. A read select multiplexer has an input receiving a read clock signal from a second clock domain, one clock output for each of the parallel registers and connected to a read clock input of a respective register, and one read select input for each clock output. A write select shift register has a number of stages corresponding to the predetermined number of registers and an output stage looped back to an input stage.

9 Claims, 3 Drawing Sheets

| | SRw | | | | | SRr | | | |
|---|---|---|---|---|---|---|---|---|---|
| a) | 1 | 0 | 0 | 0 | | 0 | 0 | 1 | 0 |
| b) | 0 | 1 | 0 | 0 | | 0 | 0 | 0 | 1 |
| c) | 0 | 0 | 1 | 0 | | 1 | 0 | 0 | 0 |
| d) | 0 | 0 | 0 | 1 | | 0 | 1 | 0 | 0 |

DATA SYNCHRONIZATION ARRANGEMENT

CROSS REFERENCE TO RELATED APPLICATIONS

This application claims priority under 35 USC § 119 of German Application Serial No. 102004011672.5, filed Mar. 10, 2004.

FIELD OF THE INVENTION

The present invention relates to a data synchronization arrangement for exchanging clocked data between different clock domains running in a digital processing equipment at the same clock frequency but at an arbitrary relative phase shift.

BACKGROUND OF THE INVENTION

A problem of metastability exists in a system where synchronous signals are exchanged between different clock domains of the same clock frequency but an arbitrary phase relation between the clock signals. Data signals that may change their logical state every clock period need some temporary storage to ensure a stable state when they are latched. In addition, the time a bit resides in a memory may be critical in some systems. So, another problem is the latency introduced in the data path when data are exchanged between different clock domains.

A conventional solution to these problems is to use a FIFO memory as a temporary storage. For write and read operations, incremented/decremented pointers are used that are synchronized to only one of the clock signals. This is not a fail-safe solution. The mean time between failure (MTBF) is a figure that depends on the phase relation between the clock signals, the offset chosen and the frequency at which the FIFO memory is operated.

SUMMARY OF THE INVENTION

The present invention provides a data synchronization arrangement that is fail-safe at high speed and low power consumption. Specifically, the invention provides a data synchronization arrangement for exchanging serial data or busses between different clock domains running in a digital processing equipment at the same clock frequency but at an arbitrary relative phase shift. The data synchronization arrangement comprises a register arrangement with a predetermined number of parallel registers, each register having a data input, a write clock input, a read clock input and a data output. A write select multiplexer has an input receiving a write clock signal from a first clock domain, one clock output for each of the parallel registers and connected to a write clock input of a respective register, and one write select input for each clock output. A read select multiplexer has an input receiving a read clock signal from a second clock domain, one clock output for each of the parallel registers and connected to a read clock input of a respective register, and one read select input for each clock output. A write select shift register has a number of stages corresponding to the predetermined number of registers and an output stage looped back to an input stage. Each stage of the write select shift register has an output connected to a respective one of the write select inputs of the write select multiplexer. The write select shift register is clocked with the write clock signal. A read select shift register has a number of stages corresponding to the predetermined number of registers and an output stage looped back to an input stage. Each stage of the read shift register has an output connected to a respective one of the read select inputs of the read select multiplexer. The read select shift register is clocked with the read clock signal. A reset circuit for initializes each shift register with a bit pattern that contains only one high value, the bit patterns in the shift registers having a constant relative offset. In operation, a clocked data input stream synchronized with the clock of the first clock domain is applied to the data inputs of the registers and a clocked data output stream synchronized with the clock of the second clock domain is taken from the data outputs of the registers.

By introducing an appropriate fixed offset between the bit patterns in the two shift registers, data are never read while they are being written. There is a selectable, but at least one full clock period between writing and reading of the same data. Depending on the performance of the registers used and/or the clock frequency, the offset between the bit patterns of the shift registers can be set by the designer such that no violation of timing requirements for the registers will occur. Further, as the offset between the bit patterns in the shift registers is a fixed offset and the frequency at which each single register is operated is the clock frequency divided by the number of parallel registers, the risk to loose a bit of information is exactly zero, and the MTBF is infinite. Also, as only one register is clocked at a time and the largest part of the circuit arrangement remains inactive, the power consumption is reduced accordingly.

In an advantageous embodiment of the invention, the shift registers have four stages, and the offset between the bit patterns amounts to two stages. For example, at reset, the write shift register is initialized to a bit pattern "1000" and the read shift register is initialized to a bit pattern "0010". Even in the worst possible case of a mutual phase difference between the clock signals (of equal frequency), there will be at least one full clock period between a write and a read of the same data.

DETAILED DESCRIPTION OF THE DRAWINGS

Figure 1:
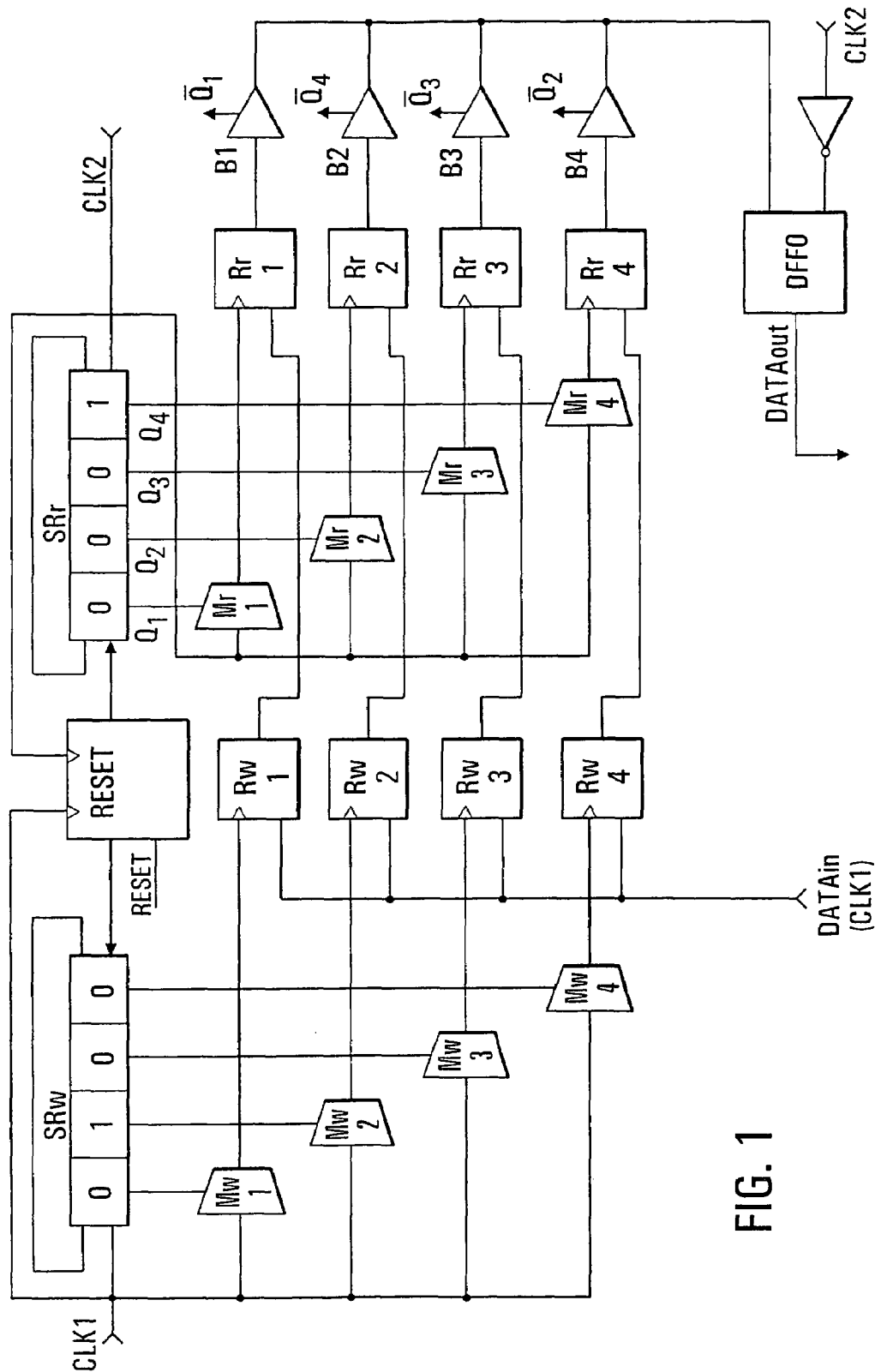
FIG. 1 is a block diagram of the data synchronization arrangement.

The data synchronization arrangement in FIG. 1 is part of a digital processing equipment and is used to exchange data between different clock domains that run at the same clock frequency with an arbitrary relative phase between the clock signals. While the invention will be disclosed with reference to bits of data that are exchanged sequentially between single data lines, it should be understood that the same concepts are applicable to busses with parallel data lines.

The arrangement includes a register arrangement with four parallel data write registers Rw1 to Rw4 and four parallel data read registers Rr1 to Rr4. Write registers Rw1 to Rw4 have their data inputs connected in parallel to a data input port DATAin. Each write register Rw1 to Rw4 has an output connected to a data input of a corresponding read register Rr1 to Rr4. In the embodiment shown, each register Rw1 to Rw4 and Rr1 to Rr4 is a D-Flip-Flop circuit.

A clock signal CLK1 from a first clock domain, referred to as the write clock signal, is selectively applied to a clock input of only one of the write registers Rw1 to Rw4 at a time by means of a write multiplexer arrangement consisting of four parallel multiplexer stages Mw1 to Mw4. Each write multiplexer stage Mw1 to Mw4 has a select input connected to one out of four outputs of a first four-stage shift register, referred to as write shift register SRw.

In a similar manner, a clock signal CLK2 from a second clock domain, referred to as the read clock signal, is selectively applied to a clock input of only one of the read registers Rr1 to Rr4 at a time by means of a read multiplexer arrangement consisting of four parallel multiplexer stages Mr1 to Mr4. Each read multiplexer stage Mr1 to Mr4 has a select input connected to one out of four outputs of a second four-stage shift register, referred to as read shift register SRr.

The outputs of the read registers Rr1 to Rr4 are each connected to an input of one out of four decoupling buffer stages B1 to B4, which have their outputs commonly connected to a data input of a D-Flip-Flop DFF0 clocked by the inverted clock signal CLK2 and the output of which is a data output port DATAout. The decoupling buffer stages B1 to B4 also receive select inputs from inverted outputs $\overline{Q1}$ to $\overline{Q4}$ of read shift register SRr to avoid contention. The selection of buffer stages B1 to B4 is such that one register output is selected at a time and the selected register output to be buffered is one of a register not clocked at the same time.

Figures 2, 4:
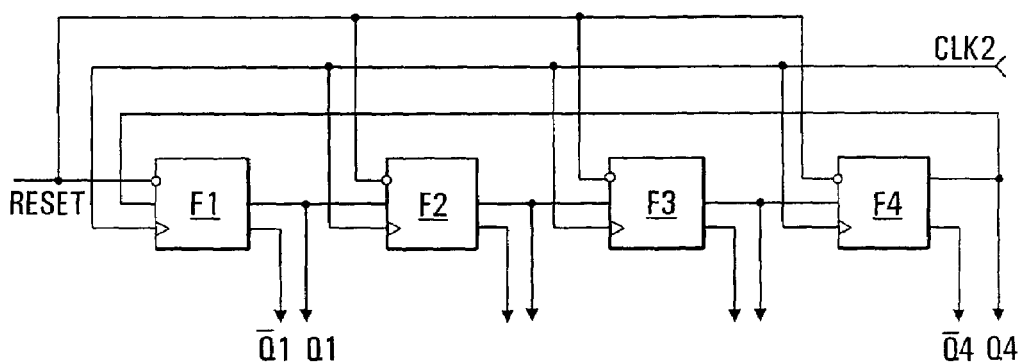
FIG. 2 is a circuit diagram of a read shift register in the arrangement of FIG. 1.
FIG. 4 is a diagram showing two mutually shifted four-bit patterns in four successive conditions.

A preferred embodiment of a shift register is shown in FIG. 2 with reference to a read shift register SRr, it being understood that the write shift register SRw would be configured in a similar manner. The shift register SRr in FIG. 2 consists of four series-connected D-Flip-Flops F1 to F4. The output of the last stage F4 is looped-back to the input of the first stage F1. Each stage has a non-inverted output (Q1 to Q4) and an inverted output ($\overline{Q1}$ to $\overline{Q4}$).

A reset synchronization circuit RESET is provided to initialize both shift registers SRw and SRr with specific four-bit patterns on each reset of the arrangement, as will be explained with reference to FIG. 3.

Figure 3:
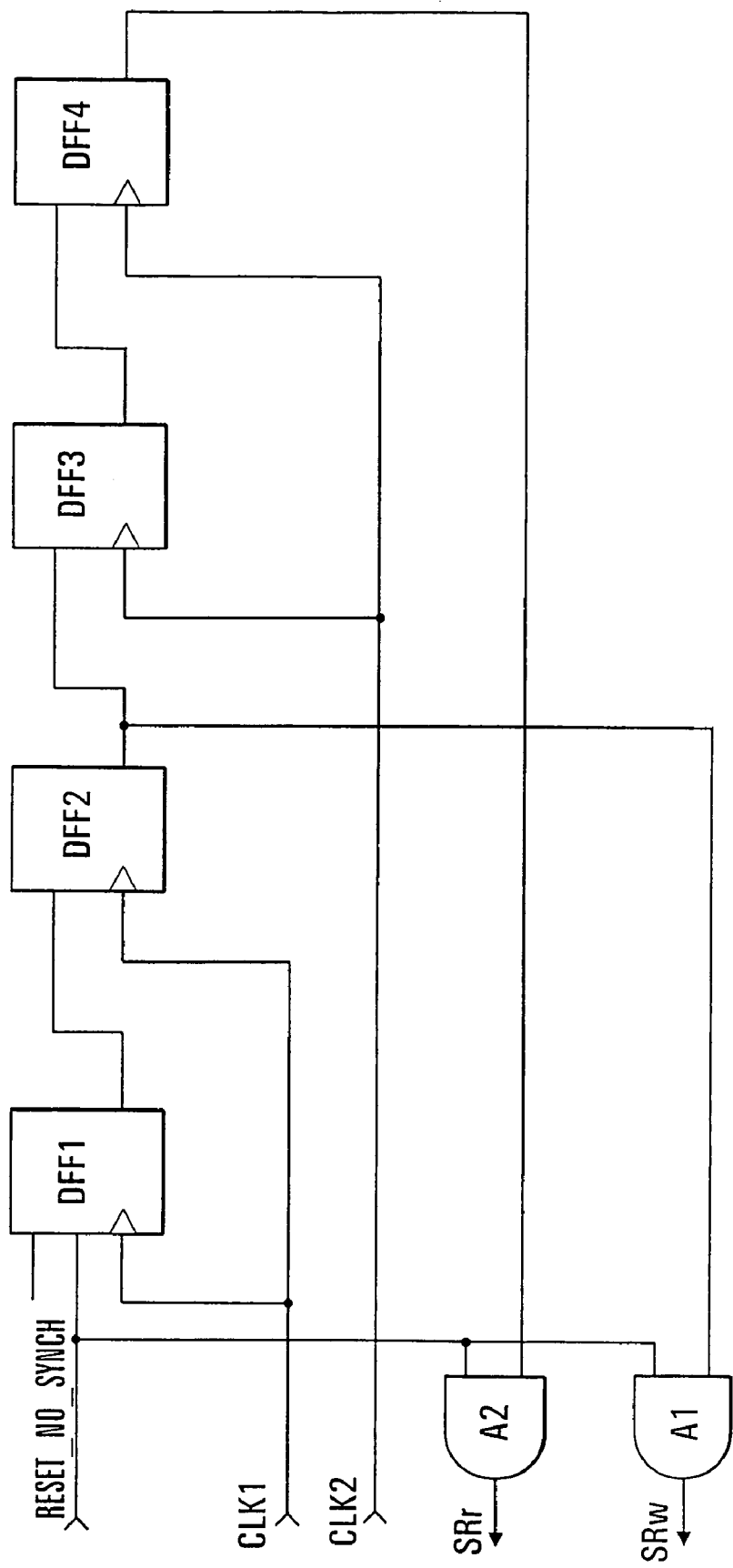
FIG. 3 is a circuit diagram of a reset synchronization circuit.

The reset synchronization circuit shown in FIG. 3 includes four D-Flip-Flops DFF1 to DFF4 connected in series and two AND gates A1 and A2. Flip-Flops DFF1 and DFF2 are clocked by the write clock signal CLK1 and Flip-Flops DFF3 and DFF4 are clocked by the read clock signal CLK2. A reset signal RESET_NO_SYNCH is applied to the data input of the first Flip-Flop DFF1 and to a first input of each AND gate A1, A2. A second input of AND gate A1 is connected to the output of Flip-Flop DFF4, and a second input of AND gate A2 is connected to the output of Flip-Flop DFF2. The synchronization of the reset signal individually and sequentially to each of the clock domains ensures a proper initial loading of the shift registers SRw and SRr with their pre-defined seed values shown in FIG. 4, from the outputs of AND gates A1 and A2, respectively.

With reference to FIG. 4, on each reset of the arrangement, the reset synchronization circuit RESET loads a bit pattern "1000" into write shift register SRw and a bit pattern "0010" into read shift register SRr. In operation, write shift register SRw is clocked by the write clock signal CLK1 from the first clock domain and the read shift register SRr is clocked by the read clock signal CLK2 from the second clock domain. The initial reset condition is shown at $a$) in FIG. 3. In FIG. 3 $b$) both bit patterns are shifted by one position in the same sense. It should be understood that shifting in both shift registers will normally not occur at exactly the same time since the write clock and the read clock may have an arbitrary phase relation. However, since the frequency of both clock signals is the same, there will never be a change in the offset between both bit patterns. Thus, as seen in FIGS. 3 $a$) to $d$), successive shifts occur in both shift registers SRw and SRr resulting always in the same offset of two bit positions. As a result of the fixed offset between the bit patterns in both shift registers, a write operation and a read operation for the same data never occur at the same time. Rather, there is always at least one full clock period between a write and a read operation for the same data.

It is thus understood that the data synchronization arrangement as disclosed passes a clocked input data stream received at port DATAin and synchronized with the clock from the first clock domain, to port DATAout and synchronized with the clock from the second clock domain without any risk of loosing a data bit, the mean time between failure (MTBF) being infinite.

Ports DATAin and DATAout may be considered as input and output of a serial interface in case serial data are exchanged.

In case data are exchanged between data busses, each bus line needs a register arrangement and a multiplexer as disclosed, but only one select mechanism with a write shift register and a read shift register is required for all bus lines.

The invention claimed is:

1. A data synchronization arrangement for exchanging clocked data between different clock domains running in a digital processing equipment at the same clock frequency but at an arbitrary relative phase shift, comprising:

a register arrangement comprising a predetermined number of parallel registers, each register having a data input, a write clock input, a read clock input and a data output, a write select multiplexer having an input receiving a write clock signal from a first clock domain, one clock output for each of said parallel registers and connected to a write clock input of a respective register, and one write select input for each clock output, a read select multiplexer having an input receiving a read clock signal from a second clock domain, one clock output for each of said parallel registers and connected to a read clock input of a respective register, and one read select input for each clock output, a write select shift register with a number of stages corresponding to the predetermined number of registers and an output stage looped back to an input stage, each stage having an output connected to a respective one of the write select inputs of the write select multiplexer, the write select shift register being clocked with the write clock signal, a read select shift register with a number of stages corresponding to the predetermined number of registers and an output stage looped back to an input stage, each stage having an output connected to a respective one of the read select inputs of the read select multiplexer, the read select shift register being clocked with the read clock signal, and a reset circuit for initializing each shift register with a bit pattern that contains only one high value, the bit patterns in the shift registers having a constant relative offset;

a data input stream synchronized with the clock of the first clock domain being applied to the data inputs of the registers and a data output stream synchronized with the clock of the second clock domain being taken from the data outputs of the registers.

2. The data synchronization arrangement of claim 1, wherein the register arrangement has four parallel registers and the relative offset of the bit patterns amounts to two stages of the shift registers.

3. The data synchronization arrangement of claim 1, wherein each register comprises a write register stage and read register stage, each write register stage having a data output connected to a data input of the corresponding read register stage.

4. The data synchronization arrangement of claim 3, wherein the register stages are formed by D-Flip-Flops.

5. The data synchronization arrangement of claim 3, wherein the outputs of the read register stages are each followed by a decoupling buffer stage each of which has a select input connected to an inverted output of the read select shift register.

6. The data synchronization arrangement of claim 5, wherein the outputs of the decoupling buffer stages are commonly connected to a data input of a D-Flip-Flop that is clocked by the clock signal from the second clock domain and that has an output providing data synchronized with the clock from the second clock domain.

7. The data synchronization arrangement according to any of claim 1, wherein the reset circuit includes four series-connected D-Flip-Flops, a first and a second one of which are clocked by the clock signal from the first clock domain and a third and a fourth one of which are clocked by the clock signal from the second clock domain, the first D-Flip-Flop having a reset input to which a reset signal is applied for initialization, the second D-Flip-Flop having an output that provides a bit pattern for initializing the write select shift register and the fourth D-Flip-Flop having an output that provides a bit pattern for initializing the read select shift register.

8. The data synchronization arrangement according to any of claim 1, wherein the data are serial data.

9. The data synchronization arrangement according to any of claim 1, wherein the data are exchanged on parallel bus lines, each bus line having an associated register arrangement and associated write and read select multiplexers, the parallel bus lines having a common select mechanism for the write and read select multiplexers.

* * * * *